United States Patent [19]

Nagahata et al.

[11] Patent Number: 5,942,075
[45] Date of Patent: Aug. 24, 1999

[54] PLASMA PROCESSING APPARATUS

[75] Inventors: Kazunori Nagahata, Nirasaki; Kazuya Nagaseki, Yamanashi, both of Japan

[73] Assignee: Tokyo Electron Limited, Tokyo, Japan

[21] Appl. No.: 08/664,500

[22] Filed: Jun. 17, 1996

[30] Foreign Application Priority Data

Jun. 18, 1995 [JP] Japan ..................................... 7-175510
May 28, 1996 [JP] Japan ..................................... 8-156141

[51] Int. Cl.$^6$ ..................................................... C23F 1/08
[52] U.S. Cl. ......................................... 156/345; 118/723 E
[58] Field of Search ....................... 156/345; 118/723 R, 118/723 E; 204/298.33, 298.37

[56] References Cited

U.S. PATENT DOCUMENTS 5,474,643  12/1995  Arami et al. .
5,499,602   3/1996  Cho ......................................... 118/712

FOREIGN PATENT DOCUMENTS 3-4530    1/1991  Japan .
3-224625  10/1991  Japan .

*Primary Examiner*—Donna C. Wortman
*Assistant Examiner*—Brenda G. Brumback
*Attorney, Agent, or Firm*—Oblon, Spivak, McClelland, Maier & Neustadt, P.C.

[57] ABSTRACT

A plasma processing apparatus includes a processing vessel for accommodating an object to be processed, a processing supplying mechanism for supplying processing gas into the processing vessel, first and second electrodes arranged to oppose each other in the processing vessel, and high-frequency power supply for supplying a high-frequency power to at least one of the first and second electrodes. The apparatus forms a plasma of the processing gas by using discharge occurring between the first and second electrodes due to the high-frequency power and performs a plasma process for the object by using the plasma. The surface of a solid except for the object to be processed in the processing vessel has a corner portion and a portion other than the corner portion, and the solid surface has a shape by which the thickness of a sheath formed between the solid surface and the plasma is nearly uniform in the corner portion and the other portion.

16 Claims, 4 Drawing Sheets

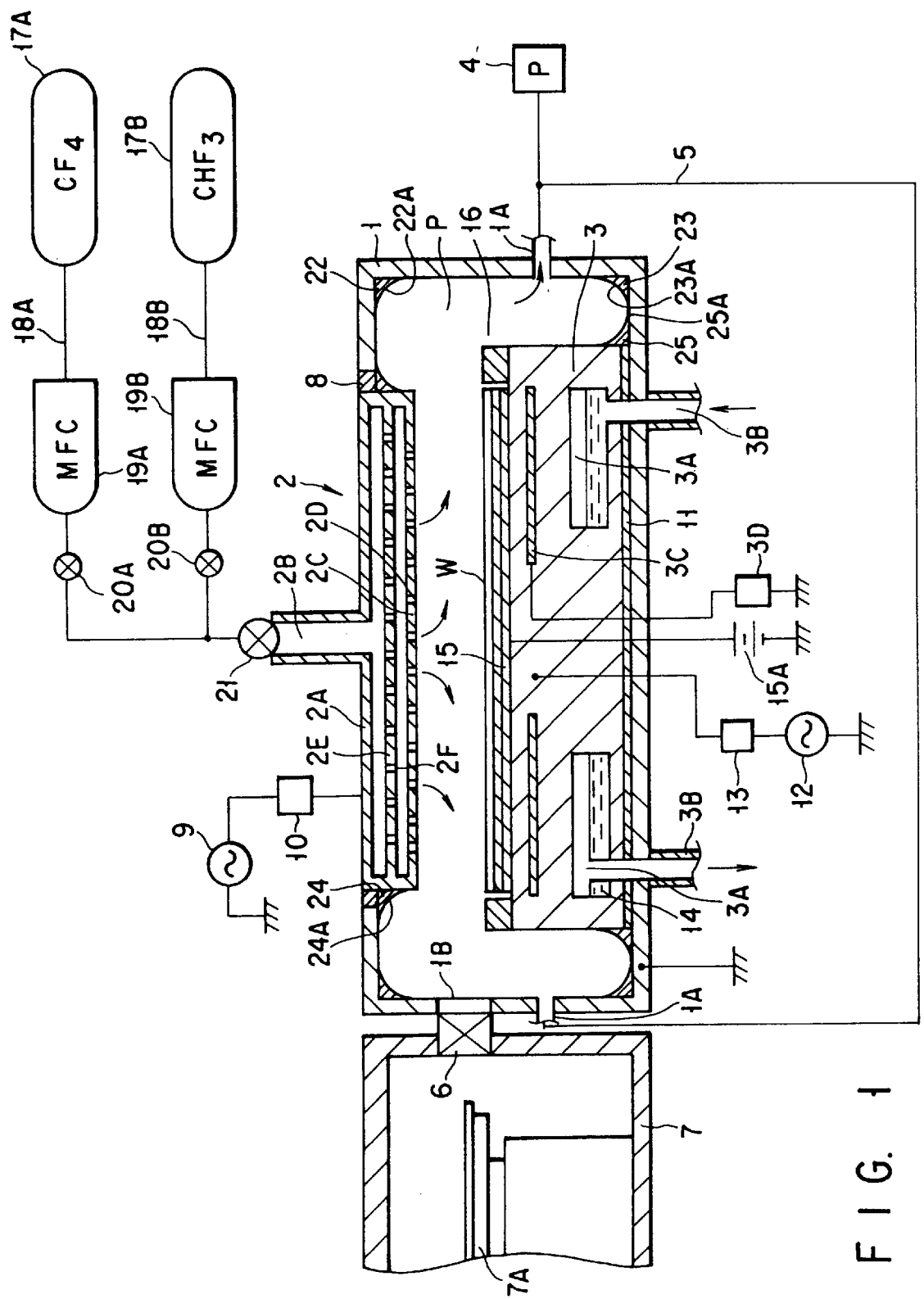
F I G. 1

PLASMA PROCESSING APPARATUS

BACKGROUND OF THE INVENTION

1. Field of the Invention

The present invention relates to a plasma processing apparatus for performing, for example, film formation, etching, or ashing by using a plasma.

2. Description of the Related Art

In the semiconductor fabrication processes, processes using a plasma such as film formation, etching, and ashing are performed. In these processes, various processing gases for film formation or film removal are used. These processing gases are formed into plasma by appropriate plasma generating means in a processing vessel and react with the surface of a semiconductor wafer in accordance with the respective purposes, thereby performing film formation or film removal. The waste gases produced by the process are exhausted from the processing vessel by an exhaust device such as a vacuum pump.

Various plasma generating means are used in these plasma processes. Among various plasma generating means a plasma processing apparatus including parallel plate electrodes is being extensively used because the apparatus can be a uniform process, can process large-diameter semiconductor wafers, and has a relatively simple construction.

Generally, the parallel-plate plasma processing apparatus comprises a lower electrode for holding a semiconductor wafer in a processing vessel, and an upper electrode arranged above and parallel to the lower electrode with a predetermined spacing between them. For example, while a reactive gas is supplied from a large number of holes formed in the surface of the upper electrode which opposes the lower electrode, a high-frequency power is applied to the lower electrode to generate a plasma between the two electrodes. This plasma is used to perform an etching or the like process for a semiconductor wafer.

To etch a silicon oxide film or a silicon nitride film formed on the surface of a semiconductor wafer, a CF-based gas such as $CF_4$ or $CHF_3$ is conventionally used as a processing gas.

In the case of etching using a CF-based gas, for example, this CF-based gas is formed into a plasma to produce active species such as ions or radicals. These active species react with a substance such as a silicon oxide film exposed into a predetermined pattern, thereby producing volatile gases such as $SiF_4$ and $CO_2$. These volatile gases are exhausted and removed from the processing vessel to the outside.

If the processing gas completely, stoichiometrically reacts with the substance on the wafer surface during this plasma process such as etching, no unreacted substance is produced. Therefore, after the reaction product is exhausted outside the processing vessel as described above, no residual substance exists in the processing vessel. However, a part of the processing gas is exhausted as it is left unreacted. Also, some active species recombine without reacting with the substance, producing a fluorocarbon-based polymer, such as $C_XF_Y$ or $C_XF_YO_Z$, as a nonvolatile reaction product. This nonvolatile reaction product adheres and deposits on the inner surface of the reaction vessel, and the deposit thus formed forms particles.

SUMMARY OF THE INVENTION

It is an object of the present invention to provide a plasma processing apparatus capable of preventing a nonvolatile reaction product formed during a plasma process from locally adhering and depositing on a specific portion such as a corner portion formed on the surface of a solid in a processing vessel, thereby suppressing the formation of particles.

According to the first aspect of the present invention, there is provided a plasma processing apparatus comprising a processing vessel for accommodating an object to be processed, and plasma generating means for generating a plasma of a processing gas in the processing vessel, the apparatus performing a plasma process for the object in the processing vessel, wherein a surface of a solid except for the object in the processing vessel has a shape by which a thickness of a sheath formed between the solid surface and the plasma is substantially uniform in any portion.

According to the second aspect of the present invention, there is provided a plasma processing apparatus comprising a processing vessel for accommodating an object to be processed, means for supplying a processing gas into the processing vessel, first and second electrodes arranged to oppose each other in the processing vessel, and high-frequency power applying means for applying a high-frequency power to at least one of the first and second electrodes, the apparatus forming a plasma of the processing gas by using discharge occurring between the first and second electrodes due to the high-frequency power and performing a plasma process for the object by using the plasma, wherein the object is supported on one of the electrodes, a corner formed in the vessel including a surface configuration so that a portion of a sheath formed between the corner and the plasma has a thickness being substantially the same as a thickness of a part of the sheath formed between a surface adjacent to the corner and the plasma, so that the corner and the surface adjacent to the corner are substantially uniformly sputtered to prevent a nonvolatile reaction product from deposition on the corner.

In the present invention, a plasma is generated in the processing vessel by the plasma generating means which is vacuum discharge, irradiation of microwaves, or the combination of the vacuum discharge or the microwave irradiation with magnetic field applying means. By using this plasma a predetermined process can be performed for the object to be processed placed in the processing vessel. The plasma spreads in the entire processing vessel to form a plasma region, and a sheath is formed between the end of the plasma region and the surfaces of the solids surrounding the plasma in the processing vessel. Since the thickness of the sheath is substantially uniform on these solid surfaces, the electric field intensity becomes substantially uniform in the entire region of the sheath. Consequently, the surfaces of the solids except for the object to be processed are substantially uniformly sputtered. This prevents a nonvolatile reaction product from locally depositing on a specific portion of the solid surfaces.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 1 is a sectional view showing an etching apparatus according to one embodiment of a plasma processing apparatus of the present invention;

DETAILED DESCRIPTION OF THE PREFERRED EMBODIMENTS

Figure 2:
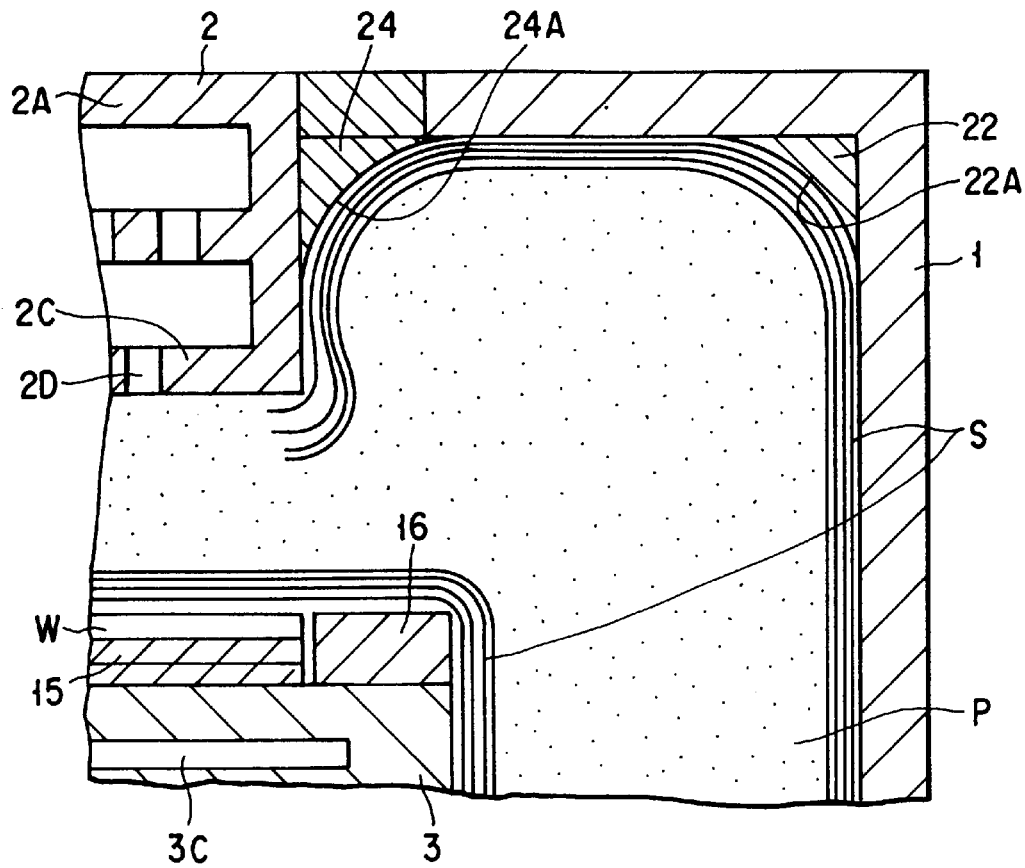
FIG. 2 is a sectional view schematically showing, in an enlarged scale, a portion of a processing vessel of the etching apparatus in FIG. 1, in order to explain a plasma sheath on the inner wall of the vessel.

The present inventors have very carefully observed the deposited state of a deposit in a processing vessel and found that a large amount of deposit adheres particularly to corner portions formed by the ceiling surface, the bottom surface, and the circumferential wall and this deposit is the cause of particles.

On the basis of this observation result, the present inventors have further made extensive studies on the fact that a reaction product readily adheres and deposits on the corner portions of a processing vessel, and found that on the surfaces of solids surrounding a plasma region in a processing vessel, a reaction product formed by a plasma process apts to stay in the corner portions of the solid surfaces. The present inventors also have found that although a plasma is inclined to minimize its spatial surface area, in a sheath formed between the end of a plasma region and each corner portion of a processing vessel the field intensity is weaker (spacings between equipotential lines are wider) than those in other portions because the sectional shape of the corner portion has substantially right angles, and a nonvolatile reaction product tends to deposit more locally in these corner portions than in other portions since these corner portions are more hard to sputter than other portions. The present inventors have completed the present invention on the basis of these findings.

Preferred embodiments of the present invention will be described below with reference to the accompanying drawings.

An etching apparatus for etching a silicon oxide film formed on the surface of a semiconductor wafer W as an object to be processed will be described.

As shown in FIG. 1, this apparatus comprises a processing vessel 1 having an airtight structure which can be held at a predetermined vacuum degree, and a pair of upper and lower electrodes 2 and 3 arranged in this processing vessel 1. Etching is performed with the semiconductor wafer W placed on the lower electrode 3.

The processing vessel 1 is a substantially cylindrical member made from aluminum whose surface is Alumite (anodized), and is grounded. An exhaust pipe 1A is attached to the lower portion of the circumferential wall of the processing vessel 1. A vacuum pump 4 is connected to this exhaust pipe 1A via an exhaust pipe 5. The processing vessel 1 is evacuated and maintained at a predetermined vacuum degree of, for example, 10 Pa, by the vacuum pump 4. A loading port 1B for loading the semiconductor wafer W into the processing vessel 1 is formed in the upper portion of the circumferential wall of the processing vessel 1. A load-lock chamber 7 is connected to the loading port 1B via a gate valve 6. A wafer loading mechanism 7A is provided in the load-lock chamber 7. The wafer loading mechanism 7A loads the semiconductor wafer W from the load-lock chamber 7 into the processing vessel 1 and unloads the wafer W from the processing vessel 1 to the load-lock chamber 7.

The upper electrode 2 has a flat, hollow disk-like structure. The upper electrode 2 is horizontally fitted in a hole formed in a central portion of the ceiling surface of the processing vessel 1 via an insulating member 8. A supply pipe 2B for supplying processing gases is connected to an upper surface 2A of the upper electrode 2. Also, gas supply holes 2D are uniformly, dispersedly formed in an entire surface 2C of the upper electrode 2, which opposes the lower electrode 3, and dispersedly supply the processing gases supplied from the supply pipe 2B into the processing vessel 1. A gas dispersing plate 2E in which a large number of holes 2F are formed is horizontally formed in the internal space of the upper electrode 2.

A high-frequency power supply 9 is connected to the upper electrode 2 via a matching circuit 10. This high-frequency power supply 9 applies a high-frequency power of, for example, 27.12 MHz, to the upper electrode 2 via the matching circuit.

The lower electrode 3 is a columnar member of, for example, aluminum, and disposed coaxially with the processing vessel 1 on the bottom surface of the vessel 1 via an insulating member 11 such as ceramics. A low-frequency power supply 12 is connected to the lower electrode 3 via a matching circuit 13. This low-frequency power supply 12 applies a low-frequency power of, for example, 800 kHz, to the lower electrode 3.

Consequently, discharge occurs via the processing gases between the upper electrode 2 applied with the high-frequency power of 27.12 MHz and the lower electrode 3 applied with the low-frequency power of 800 kHz, producing a plasma P of the processing gases. When the high-frequency power is applied to the upper electrode 2 and the low-frequency power is applied to the lower electrode 3 as described above, a high-density plasma P is produced, and ion species in the plasma P are attracted to the semiconductor wafer W by the low-frequency power of the lower electrode 3. This increases the etching rate of the semiconductor wafer W. During the process the plasma P spreads in substantially the entire internal space of the processing vessel 1.

A ring-like refrigerant reservoir 3A is formed in the lower electrode 3. The lower electrode 3 is cooled by circulating a refrigerant 14, such as perfluoropolyether, in this refrigerant reservoir 3A through a refrigerant pipe 3B. A ring-like ceramic heater 3C is embedded above the refrigerant reservoir 3A in the lower electrode 3. The lower electrode 3 is heated by this ceramic heater 3C. Accordingly, the lower electrode 3 is controlled at a predetermined temperature by properly adjusting the supply of the refrigerant 14 to the refrigerant reservoir 3A and the heating by the ceramic heater 3C. As a consequence, the semiconductor wafer W is also controlled at a predetermined temperature.

An electrostatic chuck 15 is disposed on the upper surface of the lower electrode 3. The semiconductor wafer W is electrostatically chucked by this electrostatic chuck 15. A focus ring 16 is disposed on the outer circumferential edge of the upper surface of the lower electrode 3. This focus ring 16 focuses active species in the plasma P produced between the upper and the lower electrodes 2 and 3 upon the semiconductor wafer W.

A power supply 3D is connected to the ceramic heater 3C and appropriately controls the heating temperature of the ceramic heater 3C. A DC power supply 15A is connected to the electrostatic chuck 15 and applies a high voltage to the electrostatic chuck 15. The resulting Coulomb force attracts the semiconductor wafer W to the electrostatic chuck 15.

The processing gases are supplied into the processing vessel 1 from first and second gas supply sources 17A and 17B through respective pipes 18A and 18B. These pipes 18A and 18B join in the supply pipe 2B. The processing gases reach the internal space of the upper electrode 2 through the pipes 18A and 18B and the supply pipe 2B and are supplied into the processing vessel 1 through the large number of holes 2D. Mass-flow controllers 19A and 19B and valves 20A and 20B are arranged in this order from the upstream side to the downstream side in the pipes 18A and 18B, respectively, and thereby the ratio of the flow rates of two processing gases can be controlled. The flow rate of the processing gases at a predetermined flow rate ratio are properly adjusted by a valve 21 of the supply pipe 2B.

In this embodiment, tetrafluorocarbon ($CF_4$) gas and trifluorohydrocarbon ($CHF_3$) gases are used as the processing gases, and these gases are supplied at a predetermined mixing ratio.

Ring-like members 22, 23, 24, and 25 made of an insulating material such as quartz are attached to a corner portion formed by the ceiling surface and the circumferential wall of the processing vessel 1, a corner portion formed by the bottom surface and the circumferential wall of the processing vessel 1, a corner portion formed by the circumferential surface of the upper electrode 2 and the ceiling surface of the processing vessel 1, and a corner portion formed by the circumferential surface of the lower electrode 3 and the bottom surface of the processing vessel 1.

The surfaces of these ring-like members 22, 23, 24, and 25 which surround the plasma P are curved in accordance with the outer end of the plasma P. Consequently, nonvolatile radical species do not dwell in these corner portions but readily flow along the curved surfaces. That is, the surfaces of the ring-like members 22, 23, 24, and 25 surrounding the plasma P form curved surfaces 22A, 23A, 24A, and 25A, respectively.

As illustrated in an enlarged view of FIG. 2, these curved surfaces 22A, 23A, 24A, and 25A are so curved that the thickness of a sheath S formed between each of the curved surfaces 22A, 23A, 24A, and 25A and the plasma P substantially equals the thickness of a sheath formed in other portions, for example, the inner circumferential surface, the ceiling surface, and the bottom surface of the processing vessel 1 and the surface of the lower electrode 3, and so the thickness of the sheath S is substantially uniform in the overall region on the surfaces of the solids surrounding the plasma P. In other words, as shown in FIG. 2, the spacings between equipotential lines of the sheath S on the curved surfaces 22A, 23A, 24A, and 25A are substantially the same as those in other portions, and the electric field intensity of the sheath S is substantially uniform in the overall region on the surfaces of the solids, except for the semiconductor wafer W, surrounding the plasma P.

Whether the sheath S is uniform in the overall region on the surfaces of the solids, except the semiconductor wafer W, surrounding the plasma P can be visually checked since the plasma P looks bright and the sheath S looks dark when the interior of the processing vessel is observed during the plasma process through a window (not shown) formed in the apparatus.

The ring-like members 22, 23, 24, and 25 are made of an insulating material as described above and therefore have a floating potential. Accordingly, the ring-like members 22, 23, 24, and 25 have a potential several volts (3 to 6 volts) higher than that of the wall surface of the processing vessel 1 which is grounded. However, the electric field intensity in the sheath S is substantially uniform because the potential of each of the ring-like members 22, 23, 24, and 25 is much lower than the potential (40 to 50 volts) of the plasma generated under the process conditions of the etching apparatus of this embodiment.

These ring-like members 22, 23, 24, and 25 can also be made of the same material, for example, anodized aluminum, as the wall surface of the processing vessel 1. If this is the case, however, it is necessary to take account of insulation between the wall surface of the processing vessel 1 and the upper electrode 2 or the lower electrode 3.

Note that instead of using the ring-like members 22, 23, 24, and 25, portions of the processing vessel 1 and the upper and the lower electrodes 2 and 3 corresponding to the corner portions can be curved.

Figure 3:
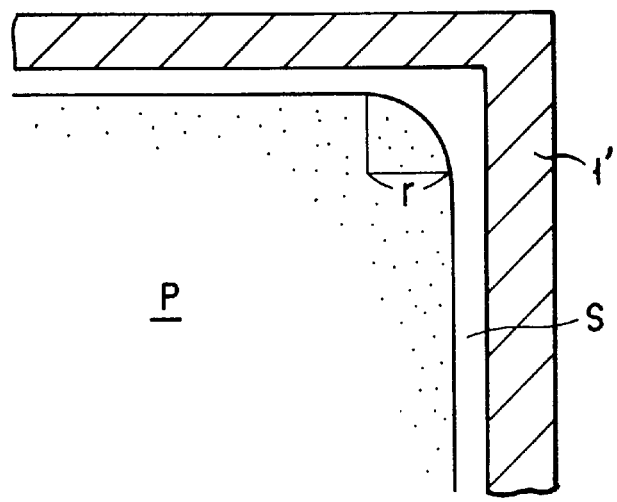
FIG. 3 is a schematic view showing the end of a plasma observed near a corner portion when the plasma is generated by using a processing vessel in which each corner portion of the inner wall surface is formed at right angles.

The curved shape of each corner portion of the processing vessel will be described below. A plasma was generated in a processing vessel by using a processing apparatus having substantially the same structure as the above processing apparatus except that no ring-like members having curved surfaces described above were used, that is, the corner portions of the processing vessel had right angles. Note that the processing vessel was so designed that its corner portions could be observed. The shape of a sheath (dark portion) S in the corner portion of the processing vessel (denoted by reference numeral 1' in FIG. 3) was observed. Consequently, as illustrated in FIG. 3, the sheath S, that is, the outer end of the plasma P had substantially the shape of an arc. Assuming the radius of curvature of this arc is r, r changes in accordance with the discharge conditions such as the power and the pressure. r was about 1 to 2 cm under the discharge conditions used in the actual process.

The fact that the plasma P has the radius of curvature r in the corner portion of the processing vessel can be qualitatively, roughly explained as follows.

Figure 4A:
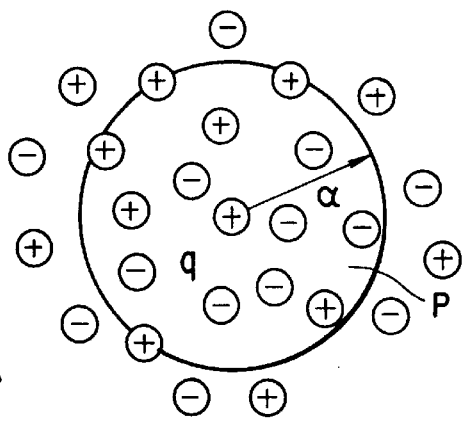
FIGS. 4A and 4B are views showing the charge distribution of a plasma.
Figure 4B:
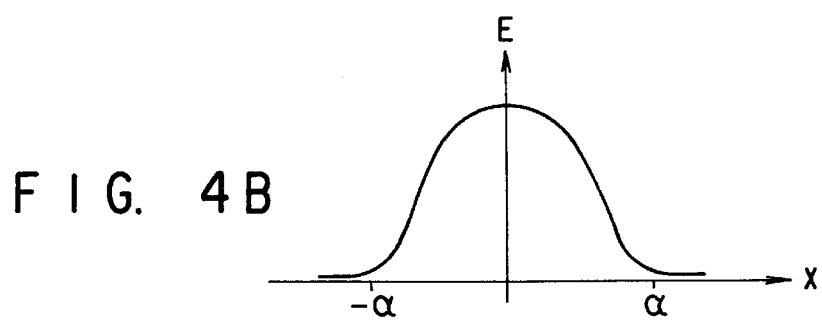

Generally, in order for a certain space as shown in FIGS. 4A and 4B to be maintained as a plasma P, an electric field formed by a given charged particle (q) in the plasma P must be canceled by an electric field formed by another charged particle with a reverse charge existing in the range of a distance $\alpha$, and the electric field formed by the charged particle (q) is zero in the space outside this range, and must be electrically neutral. The distance $\alpha$ by which this condition is established is about five times a Debye length $\lambda d$ (Yikio Mizuno, "Plasma Physics", Kyoritsu Shuppan K. K., pp. 9 to 12).

Figure 5:
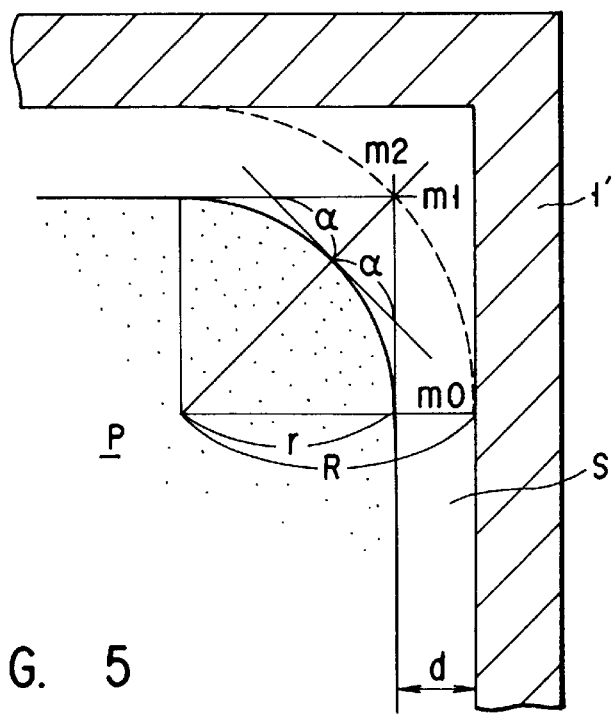
FIG. 5 is a schematic view for explaining the method of calculating the radius of curvature of the corner portion shown in FIG. 3 when a curved shape is formed in the corner portion.

Assuming, as illustrated in FIG. 5, that the boundaries of the sheath in a flat portion are m1 and m2 and the tangent of an arc formed by the boundaries of the sheath is mo, it is considered that the length of a line segment connecting the intersections of the tangent mo and the boundaries m1 and m2 is not smaller than $2\alpha$ in order for the above neutral condition to be satisfied in the corner portion. Therefore, the radius of curvature r of the plasma can be estimated as indicated by the following equation:

$$r = (1+\sqrt{2})\alpha \approx 12\lambda d \text{ (where } \alpha \approx 5\lambda d)$$

Note that λd can be calculated by substituting plasma parameters (plasma density (positive ion density: ni, electron temperature: Te, and plasma potential: Vp) into an equation for obtaining the Debye length presented in the reference cited above.

Accordingly, discharge was performed under the discharge conditions when the radius of curvature r of the plasma P was actually measured by using the processing vessel 1' shown in FIG. 3, and the plasma parameters near the wall of the processing vessel 1' were measured by using a Langmuir probe. The results were as follows:

$$10^7 \text{ cm}^{-3} < ni < 10^8 \text{ cm}^{-3}$$

$$3 \text{ eV} < Te < 4 \text{ eV}, 40V < Vp < 50V$$

The Debye length λAd was calculated by substituting these measured values into the equation of the above reference, and this calculated value of the Debye length λd was substituted into the above equation to calculate the radius of curvature r of the plasma. Consequently, r was 1 to 3 cm, i.e., substantially agreed with the observed value (1 to 2 cm).

On the other hand, a sheath thickness d in a flat portion free from the influence of the corner portion can be calculated by substituting the plasma parameters described above into an equation (Shinriki Teii, "Plasma Basic Engineering", Uchida Rohkakuho, pp. 27 to 29) which represents the Child-Langmuir rule. Under the condition the calculated value of the sheath thickness d is 1 to 3 cm.

Accordingly, a radius of curvature R of the corner portion of the processing vessel 1' by which no deposit adheres to the corner portion is given by R≧r+d. That is, when the corner portion has this radius of curvature R, the sheath thickness d in the corner portion is substantially equal to the sheath thickness in a flat portion, and no deposit adheres even in the corner portion.

In the apparatus of this embodiment, it was confirmed that no deposit adhered to the corner portions when the radius of curvature R of the corner portions was set to R≧2 to 3 cm. Note that the radius of curvature of the curved portion formed in the corner portion can be calculated on the basis of the plasma parameters as described above and also can be obtained by directly observing the plasma P.

The operation of the etching apparatus according to this embodiment will be described below.

First, the gate valve 6 is opened, and the semiconductor wafer W in the load-lock chamber 7 is loaded onto the electrostatic chuck 15 in the processing vessel 1 by the wafer loading mechanism 7A in the load-lock chamber 7. Since a high voltage is applied to the electrostatic chuck 15, the resulting Coulomb force chucks the semiconductor wafer W onto the electrostatic chuck 15. After loading the semiconductor wafer W, the wafer loading mechanism 7A moves backward from the gate valve 6 into the load-lock chamber 7. The gate valve 6 is then closed.

The vacuum pump 4 is operated to evacuate the processing vessel 1. When a predetermined vacuum degree is reached, the first and the second gas supply sources 17A and 17B supply $CF_4$ and $CHF_3$ gases, respectively, as processing gases. The flow rate ratio ($CF_4/CHF_3$) of the processing gases is adjusted to, for example, 25 sccm/75 sccm, by the mass-flow controllers 19A and 19B, the valves 20A and 20B, and the valve 21. The processing vessel 1 is kept evacuated while these processing gases are supplied, and the processing gas pressure in the processing vessel 1 is kept at, for example, 10 Pa.

In this state, a high-frequency power of 2000 W is applied to the upper electrode 2 and a low-frequency power of 800 W is applied to the lower electrode 3. Consequently, discharge occurs between the electrodes 2 and 3 and generates a plasma P. The processing gases are dissociated to produce fluorine radicals, and these fluorine radicals etch the silicon oxide film on the semiconductor wafer W.

The plasma P thus generated spreads outward from between the electrodes 2 and 3 and reaches the vicinities of the surfaces of the solids in the processing vessel 1. That is, the plasma P spreads to the vicinities of the curved surfaces 22A, 23A, 24A, and 25A of the ring-like members 22, 23, 24, and 25 formed in the corner portions of the processing vessel 1 and to the vicinities of the other solid surfaces, thereby forming a sheath S between the plasma and each surface.

Since the curved surfaces 22A, 23A, 24A, and 25A are formed in the corner portions, no nonvolatile reaction product stays in these corner portions. Also, the curved surfaces 22A, 23A, 24A, and 25A are so curved that the sheath thickness is substantially uniform in these corner portions and other portions. Therefore, the electric field intensity is substantially uniform in the overall region of the sheath S, and so these corner portions are substantially uniformly sputtered as in other portions. Consequently, a nonvolatile reaction product can be prevented from locally depositing on these corner portions. When the inner wall surface of the processing vessel 1 was observed after the etching process as above was repeatedly executed, the curved surfaces 22A, 23A, 24A, and 25A in the corner portions of the processing vessel 1 were in the same condition as the other portions of the inner wall surface of the processing vessel 1. That is, no nonvolatile reaction product locally adhered nor deposited on the curved surfaces 22A, 23A, 24A, and 25A.

In the etching apparatus according to this embodiment as described above, the ring-like members 22, 23, 24, and 25 are attached to the corner portions of the surfaces of the solids, except for the semiconductor wafer W, surrounding the plasma P in the processing vessel 1, and the curved surfaces 22A, 23A, 24A, and 25A corresponding to the shape of the outer end of the plasma P are formed as the surfaces of these ring-like members 22, 23, 24, and 25. When a plasma process is performed, therefore, the curved surfaces 22A, 23A, 24A, and 25A in the corner portions are substantially uniformly sputtered as in other flat portions. Consequently, no nonvolatile reaction product locally adheres nor deposits on the curved surfaces 22A, 23A, 24A, and 25A. This suppresses the formation of particles caused by a deposit.

Another embodiment of the present invention will be described below.

Figure 6:
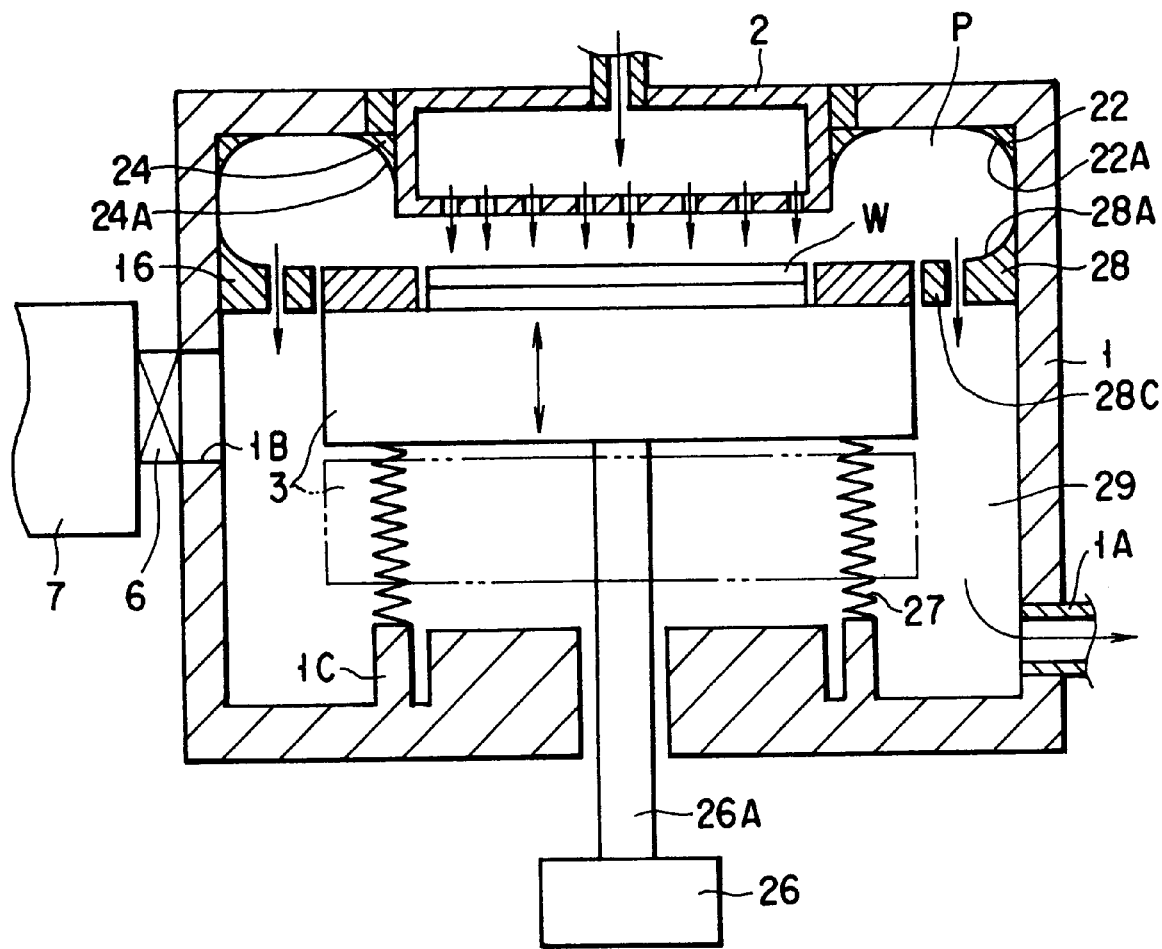
FIG. 6 is a sectional view showing an etching apparatus according to another embodiment of the plasma processing apparatus of the present invention.

FIG. 6 is a sectional view showing an etching apparatus according to another embodiment of the present invention. In this embodiment, the characteristic feature of the etching apparatus of the embodiment will be principally described. The same reference numerals as in the etching apparatus shown in FIG. 1 denote the same or equivalent parts in FIG. 6 and a detailed description thereof will be omitted.

As shown in FIG. 6, the etching apparatus of this embodiment has the same construction as the etching apparatus in FIG. 1 except that a lower electrode 3 can be elevated. (Note that a high-frequency power supply and the like components are omitted from FIG. 6.)

In this embodiment, an elevating mechanism 26 is coupled to the center of the lower surface of the lower electrode 3 via a rod 26A, and the lower electrode 3 can be elevated by this elevating mechanism 26. That is, as in FIG. 6, the lower electrode 3 is moved up and down by the elevating mechanism 26 between the position indicated by the alternate long and two dashed lines and the position indicated by the solid lines. When a semiconductor wafer W is loaded into a processing vessel 1, the lower electrode 3 is moved down to the position indicated by the alternate long and two dashed lines. When etching is performed, the lower electrode 3 is moved up to the position indicated by the solid lines to form a predetermined gap between the lower electrode 3 and an upper electrode 2. The upper end of a cylindrical bellows 27 is connected to the lower surface of the lower electrode 3. A cylindrical projection 1C on the bottom surface of the processing vessel 1 is connected to the lower end of the bellows 27. This bellows 27 maintains the airtightness in the processing vessel 1 and also supports the lower electrode 3 so that the lower electrode 3 can be moved up and down.

A ring-like sealing member 28 made from anodized aluminum is attached to the wall of the processing vessel 1 around the lower electrode 3. When a plasma process is performed, the ring-like sealing member 28 partitions the space where the semiconductor wafer W exists from a lower space 29, sealing a plasma P on the side of the electrodes 2 and 3. This ring-like sealing member 28 has a width covering the spacing between the lower electrode 3 and the inner circumferential surface of the processing vessel 1. A projection is formed on the outer circumferential edge of the upper surface of the ring-like sealing member 28, forming a curved surface 28A in the corner portion between the ring-like sealing member 28 and the inner circumferential surface of the processing vessel 1. The upper surface of the inner circumferential edge of the ring-like sealing member 28 is so adjusted as to be level with the upper surface of a focus ring 16. A plurality of holes 28C are formed in the circumferential direction in this ring-like sealing member 28. Gases used in a plasma process are exhausted from these holes 28C through the lower space 29 and an exhaust nozzle 1A. Note that the ring-like sealing member 28 can also be made from an insulating material such as quartz.

In this embodiment, the lower electrode 3 is raised by the elevating mechanism 26 from the position indicated by the alternate long and two dashed lines to the position indicated by the solid lines in the vicinity of the upper electrode 2, thereby forming a predetermined gap between the two electrodes 2 and 3. At the same time, a plasma processing space partitioned from the lower space 29 of the processing vessel 1 is formed in the upper portion of the processing vessel 1 by the ring-like sealing member 28. Thereafter, a high-frequency power is applied to the upper electrode 2 and a low-frequency power is applied to the lower electrode 3 to generate a plasma P in the processing space. The semiconductor wafer W placed on the lower electrode 3 is etched by this plasma P.

Curved surfaces 22A, 24A, and 28A having a shape corresponding to the shape of the outer end of the plasma P are formed in the corner portions of the surfaces of the solids surrounding the processing space, that is, the corner portion between the ceiling surface and the inner circumferential surface of the processing vessel 1, the corner portion between the outer circumferential surface of the upper electrode 2 and the ceiling surface of the processing vessel 1, and the corner portion between the ring-like sealing member 28 and the inner circumferential surface of the processing vessel 1. Therefore, no nonvolatile reaction product stays in these corner portions. That is, since these corner portions are sputtered to the extent to which other portions are sputtered, no nonvolatile reaction product locally deposits in these corner portions. Accordingly, it is possible to suppress the formation of particles and achieve an effect similar to that in the first embodiment.

The present invention is not limited to the above embodiments and various modifications of the invention are possible. For example, the plasma generating means can apply a high-frequency power only to one of the upper and lower electrodes, can use microwaves, or can be used together with a magnetic field applying means. The present invention can also be applied to plasma processing apparatuses for performing, e.g., CVD and ashing, other than etching.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A plasma processing apparatus comprising:
   a processing vessel for accommodating an object to be processed;
   means for supplying a processing gas into said processing vessel;
   first and second electrodes arranged to oppose each other in said processing vessel; and
   high-frequency power applying means for applying a high-frequency power to at least one of said first and second electrodes,
   said apparatus forming a plasma of the processing gas by using discharge occurring between said first and second electrodes due to the high-frequency power and performing a plasma process for the object by using the plasma,
   wherein said object is supported on one of said electrodes, a corner formed in the vessel having a surface configuration so that a portion of a sheath formed between said corner and the plasma has a thickness being substantially the same as a thickness of a part of the sheath formed between a surface adjacent to said corner and the plasma, so that said corner and the surface adjacent to said corner are substantially uniformly sputtered to prevent a nonvolatile reaction product from deposition on said corner.

2. An apparatus according to claim 1, wherein said apparatus further comprises ring-like sealing means for sealing the plasma on a side of the object, provided between an outer circumferential surface of an electrode on which the object to be processed is placed and an inner circumferential surface of said processing vessel.

3. An apparatus according to claim 2 wherein said ring-like sealing means includes an exposed surface facing the plasma, which has such a surface configuration so that a portion of the sheath formed between the exposed surface and the plasma has a thickness being substantially the same as a thickness of a portion of the sheath formed between a circumferential surface of the vessel and the plasma.

4. An apparatus according to claim 2, wherein the corner portion of the solid surface in said processing vessel has a curved surface having a sheath thickness substantially equal to a sheath thickness of the other portion.

5. An apparatus according to claim 4, wherein the curved surface has a radius of curvature by which the sheath thickness is constant.

6. An apparatus according to claim 5, wherein the radius of curvature is not less than 2 cm.

7. A processing apparatus comprising:

a processing vessel having a processing chamber therein for accommodating an object to be processed, the processing vessel including an upper wall, a bottom wall, and a circumferential wall extended between the upper and bottom walls and connected to the upper and bottom walls at both ends of the circumferential wall, so that corners are formed at the ends of the circumferential wall of the processing vessel by the circumferential wall and the upper and bottom walls;

first and second electrodes provided in the processing chamber, one of the first and second electrodes supports an object to be processed;

means for supplying a processing gas into the processing vessel;

means for applying a high frequency power between the first and second electrodes to generate a plasma of the processing gas in the processing vessel, so that the object mounted on the supporting surface of the one of the first and second electrodes is subjected to a plasma process; and an element provided to a first corner of the corners formed at the ends of the circumferential walls and having an inclined surface exposed to the processing chamber, the inclined surface having a circular curved depression for substantially equalizing a thickness of a sheath portion formed between the inclined surface and the plasma to a thickness of a sheath portion between the circumferential wall of the processing vessel and the plasma.

8. An apparatus according to claim 7 wherein said first electrode is mounted on the bottom wall of the processing vessel, projects therefrom toward the second electrode, and has a circumferential surface which forms a second corner together with the bottom wall, and which further comprises an auxiliary element provided at said second corner formed by the circumferential surface of the first electrode and the bottom wall of the processing vessel, the inclined surface having a circular curved depression for substantially equalizing a thickness of a sheath portion formed between the inclined surface of the auxiliary means and the plasma to a thickness of a sheath portion between the circumferential wall of the first electrode and the plasma.

9. An apparatus according to claim 7 wherein said second electrode is mounted on the upper wall of the processing vessel, projects therefrom toward the first electrode, and has a circumferential surface which forms a second corner together with the upper wall, and which further comprises an auxiliary element provided at said second corner formed by the circumferential surface of the second electrode and the upper wall and having an inclined surface exposed to the processing chamber, the inclined surface having a circular curved depression for substantially equalizing a thickness of a sheath portion formed between the inclined surface of the auxiliary means and the plasma to a thickness of a sheath portion between circumferential surface of the second electrode and the plasma.

10. An apparatus according to claim 7 wherein the circular curved depression of the projecting means has a substantially similar curvature to that of the sheath portion.

11. An apparatus according to claim 7 wherein said element includes a ring shaped member attached to said first corner.

12. An apparatus according to claim 7 wherein said element is integral with the processing vessel.

13. An apparatus according to claim 7 wherein said element is made of the same or different material from the circumferential wall of the processing vessel.

14. A processing apparatus comprising:

a processing vessel having a processing chamber therein for accommodating an object to be processed, the processing vessel including an upper wall, a bottom wall, and a circumferential wall extended between the upper and bottom walls and connected to the upper and bottom walls at both ends of the circumferential wall, so that corners are formed at the ends of the circumferential wall of the processing vessel by the circumferential wall and the upper and bottom walls;

at least one electrode provided in the processing chamber;

a ring shaped member attached to a first corner of the corners formed at the ends of the circumferential wall and having surface with a curved depression exposed to the processing chamber, the ring shaped member electrically insulated from the processing vessel;

means for supplying a processing gas into the processing vessel; and means for applying a high frequency power to the at least one electrode to generate a plasma of the processing gas in the processing vessel, so that the object accommodated in the processing chamber is subjected to a plasma process.

15. An apparatus according to claim 14 wherein the said curved depression is a circular curved depression having a substantially similar curvature to that of a sheath portion formed between the plasma and the said first corner.

16. An apparatus according to claim 14 wherein said ring shaped member is made of insulating material, and the circumferential wall of the processing vessel is made of conductive material.

\* \* \* \* \*